(12) United States Patent
Kitamura et al.

(10) Patent No.: US 7,298,002 B2
(45) Date of Patent: Nov. 20, 2007

(54) HEMISPHERICAL SILICON GRAIN CAPACITOR WITH VARIABLE GRAIN SIZE

(75) Inventors: Hiroyuki Kitamura, Tokyo (JP); Yuki Togashi, Tokyo (JP); Hiroyasu Kitajima, Tokyo (JP); Noriaki Ikeda, Tokyo (JP); Yoshitaka Nakamura, Tokyo (JP); Eiichiro Kakehashi, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 0 days.

(21) Appl. No.: 11/165,034

(22) Filed: Jun. 24, 2005

(65) Prior Publication Data

US 2006/0022251 A1 Feb. 2, 2006

(30) Foreign Application Priority Data

Jun. 24, 2004 (JP) ............................. 2004-186805
Jun. 22, 2005 (JP) ............................. 2005-181977

(51) Int. Cl.
*H01L 27/108* (2006.01)

(52) U.S. Cl. .................. 257/309; 257/68; 257/295; 257/905; 257/534; 257/E21.647; 438/665

(58) Field of Classification Search .................. None
See application file for complete search history.

(56) References Cited

U.S. PATENT DOCUMENTS 5,358,888 A * 10/1994 Ahn et al. .................. 438/396
6,150,216 A 11/2000 Lin et al. .................... 438/255
6,399,439 B1 * 6/2002 Yamanishi et al. .......... 438/255
6,537,872 B1 3/2003 Tsao et al. .................. 438/244
2004/0053474 A1 * 3/2004 Shin et al. .................. 438/381

FOREIGN PATENT DOCUMENTS

| JP | 2000-196042 | 7/2000 |
| JP | 2000-216346 | 8/2000 |
| JP | 2001-196562 | 7/2001 |
| JP | 2002-222871 | 8/2002 |
| JP | 2002-334940 | 11/2002 |
| JP | 2002-368133 | 12/2002 |
| KR | 2003/0056805 | 7/2003 |

* cited by examiner

*Primary Examiner*—Sue A. Purvis
*Assistant Examiner*—Scott R. Wilson
(74) *Attorney, Agent, or Firm*—Young & Thompson

(57) ABSTRACT

A semiconductor device includes cylindrical capacitors each including corresponding cylindrical electrodes. Each cylindrical electrode includes hemispherical silicon grains. The hemispherical silicon grains protruding from an upper region of the cylindrical electrode have a large size, and the hemispherical silicon grains protruding from a lower region of the cylindrical electrode have a small size or the lower region of the cylindrical electrode has no hemispherical silicon grains.

7 Claims, 12 Drawing Sheets

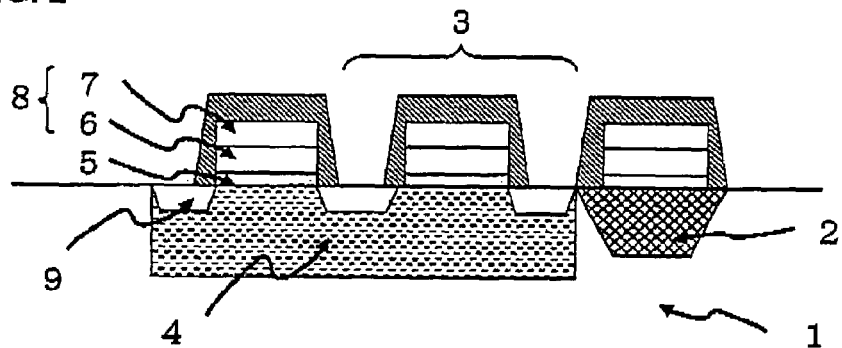
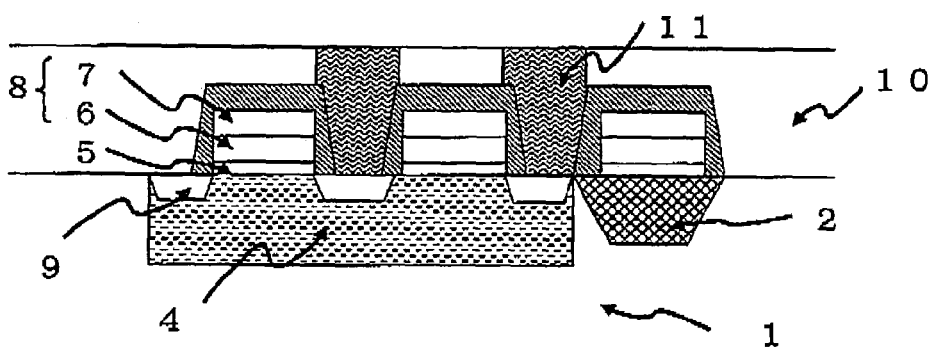
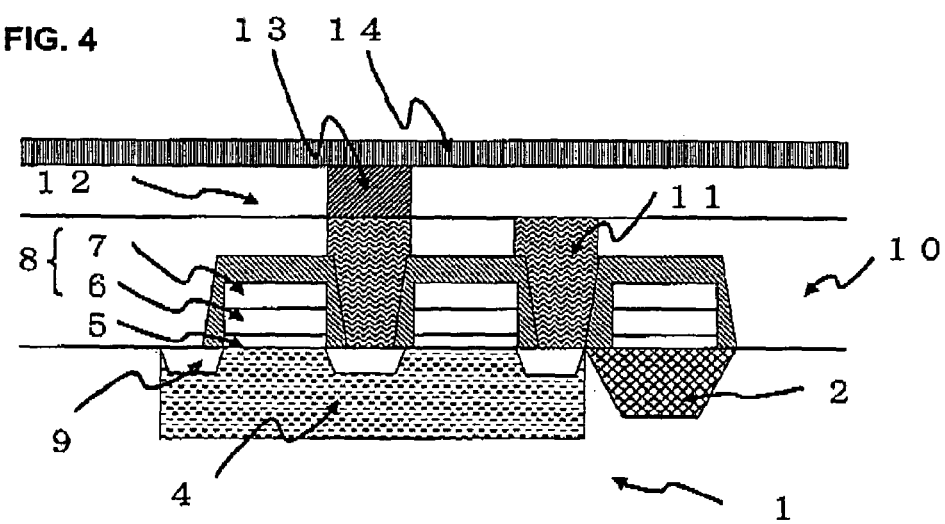

HEMISPHERICAL SILICON GRAIN CAPACITOR WITH VARIABLE GRAIN SIZE

This application claims priority to prior Japanese patent applications JP 2004-186805 and 2005-181977, the disclosures of which are incorporated herein by reference.

BACKGROUND OF THE INVENTION

1. Field of the Invention

The present invention relates to semiconductor devices and methods for manufacturing -semiconductor devices. The present invention particularly relates to a semiconductor device including a cylindrical capacitor and a method for manufacturing such a semiconductor device.

2. Description of the Related Art

In recent years, semiconductor devices with a large capacity have been increasingly demanded. Therefore, dynamic random access memories (DRAMs) with a large capacity, for example, a capacity of 1 Gbit, are in practical use.

Memory cells for DRAMs usually each include a gate transistor and a capacitor. The charge stored in the capacitor corresponds to information and is transferred with the transistor. The capacitor is connected to a diffusion layer electrode of the transistor and placed above the diffusion layer electrode or placed over a gate electrode and the diffusion layer electrode. The capacitor includes a lower electrode connected to the diffusion layer electrode, a commonly connected upper electrode, and a capacitor insulating layer placed therebetween.

A reduction in the size of gate transistors leads to a reduction in the area occupied by each capacitor. However, the capacitor needs to have a capacitance sufficient to ensure the operation of a memory because the charge stored in the capacitor corresponds to information. The following techniques are effective In achieving small-sized capacitors with a sufficient capacitance: the use of insulating films (dielectric films) with a small thickness, the use of capacitor insulating layers with a large dielectric constant, the use of capacitor electrodes with a large surface area, and the like.

That is, such thin dielectric films or high-surface area capacitors are used. In order to achieve the thin dielectric films, known dielectric films are reduced in thickness or a new material with a large dielectric constant is used. This leads to a decrease in reliability.

There are two solutions to achieve the high-surface area capacitors: one is to use cylindrical capacitors having a large aspect ratio and the other one is to use rough silicon layers or silicon layers having hemispherical silicon grains (hereinafter referred to as HSGs) protruding therefrom.

A HSG layer is formed as follows: an amorphous silicon layer for forming the lower electrode of a cylindrical capacitor is formed and then seeded by heat-treating the amorphous silicon layer in an atmosphere containing $SiH_4$ or $SiH_6$ and the resulting amorphous silicon layer is further heat-treated under high vacuum conditions, whereby HSGs are formed so as to protrude from the amorphous silicon layer. Silicon atoms provided by the seeding treatment are allowed to migrate to create crystal grains by the heat treatment.

When the amorphous silicon layer contains a large amount of an impurity such as phosphorus (P), the crystal grains cannot be sufficiently grown because the impurity inhibits the migration of the silicon atoms. In usual, the HSG layer is prepared by heat-treating the amorphous silicon layer having an impurity concentration of 1E20 to 2E20 atoms/cm$^3$ or a smaller impurity concentration. If the obtained HSG layer has unsatisfactory electrical properties due to the low impurity concentration, the HSG layer is doped with P by heat-treating the HSG layer in an atmosphere containing $PH_3$, whereby the impurity concentration of the HSG layer is increased. According to this technique, capacitors with a surface area about two times greater than that of known capacitors can be prepared; hence, small-sized memory cells with a desired capacity can be obtained. Higher advantages can be obtained if this technique is used in combination with the two techniques described above.

A reduction in the size of gate transistors leads to a reduction in the size of cylindrical capacitors; hence, the cylindrical capacitors have a small diameter and the distance between the cylindrical capacitors adjacent to each other is small. On the other hand, the HSG layer is readily peeled off. The peeled. HSG layer causes a short circuit between the cylindrical capacitors. This causes a reduction in the yield of memories. In order to prevent the short circuit which is occurs due to the peeling of the HSG, it is necessary to partly inhibit the growth of HSGs.

Japanese Unexamined Patent Application Publication Nos. 2000-196042, 2002-368133, and 2000-216346 (hereinafter referred to as Patent Documents 1, 2, and 3, respectively) disclose techniques for partly inhibiting HSGs from growing from cylindrical electrodes from which HSG layers are readily peeled off. According to Patent Documents 1 and 2, the HSGs protruding from the top ends of cylinder electrodes and the HSGs protruding from edges of box-shaped electrodes are prevented from growing, whereby short circuits are prevented from occurring between these electrodes. According to Patent Document 3, the HSGs placed protruding from the outer walls of cylindrical electrodes have a size different from that of the HSGs protruding from the inner walls thereof.

Japanese Unexamined Patent Application Publication No. 2001-196562 (hereinafter referred to as Patent Document 4) discloses a technique for preventing oxides in contact with cylinder walls from being exposed due to the removal of electrodes placed on the cylinder walls during the formation of HSGs. Japanese Unexamined Patent Application Publication No. 2002-222871 (hereinafter referred to as Patent Document 5) discloses a technique for reducing process cost and increasing throughput by forming HSGs in one step. Japanese Unexamined Patent Application Publication No. 2002-334940 (hereinafter referred to as Patent Document 6) discloses a technique for reducing the resistance of a concave capacitor having an inner wall with HSGs by directly connecting a contact plug to a metal wire.

In the above known techniques, the HSGs are formed in one step, the resistance of the capacitor is reduced, a short circuit is prevented from occurring due to the peeled HSG layer, or the adjacent cylindrical capacitors are prevented from being short-circuited. Methods for manufacturing small-sized capacitors for DRAMs and configurations of such capacitors are problematic as described below.

In order to increase the integration density of memory cells, holes are formed by etching so as to have a high aspect ratio. Such holes have lower zones having a diameter less than that of upper zones thereof. With reference to FIG. 23A, a mask insulating layer 33 and a second interlayer insulating layer 34 are arranged on a first interlayer insulating layer 31 including contact plugs 32. Capacitor holes 35, formed by lithography, for forming cylindrical capacitors extend through the mask insulating layer 33 and the second interlayer insulating layer 34. Each capacitor hole 35 has an top opening, represented by a-a', having a diameter equal to the design value and lower zones, represented by b-b', c-c', or d-d', each having a diameter different from the design value when the capacitor holes 35 are formed by lithography.

The diameter of the top opening a-a' is the same as the design value. However, the upper zone b-b' located below the top opening a-a' has a diameter greater than that of the top opening a-a' and the lower zone c-c' located below the upper zone b-b' has a diameter less than that of the upper zone b-b', the lower zone C-C' is tapered toward its bottom. And the capacitor hole 35 has a so-called bowing shape in cross section. For current high-capacity memories having holes with an aspect ratio of ten or more, lower regions of the holes are hard to etch because etching gas is not sufficiently supplied to the lower regions. Therefore, there is a problem that the diameter of the lower regions becomes small.

The capacitor hole 35 needs to be connected to each contact plug 32 placed thereunder. The bottom of the capacitor hole 25 is in contact with the mask insulating layer 33, which is therefore referred to as an etching stopper. When the mask insulating layer 33 is etched, the first interlayer insulating layer 31 is partly etched if the capacitor hole 35 is misaligned with the contact plug 32. Therefore, there is a problem in that the lower zone d-d' of the capacitor hole 35 that is in contact with a side face of the contact plug 32 has a size less than that of other zones That is, in the capacitor hole 35, tie lower zone c-c' has a diameter less than its design value and the lower zone d-d' has a size less than its design value.

A silicon layer 36 for forming cylindrical lower electrodes for capacitors is formed over formed on the walls and bottoms of the capacitor holes 35 having the above shape. The silicon layer 36 is treated, whereby the lower electrodes having HSGs 37 are prepared. A capacitor insulating layer 38 is then formed so as to cover the HSGs 37. The HSGs 37 are densely arranged or are in contact with each other at the lower zone of the lower electrodes. The lower zone of the lower electrodes has a size less than its design value. For example, the lower zone is the bottoms of hole, the lower zone d-d' and the lower zone c-c'. Since the capacitor Insulating layer 38 is not uniformly grown on the HGGs 37 densely arranged the capacitor insulating layer 38 is not uniform in thickness and therefore has thin sections.

Since the HSGs 37 protrude from the lower electrodes having narrow regions with sizes less than their design values as shown in FIG. 23B, the HSGs 37 protruding from a circumferential zone of the inner wall of each lower electrodes are in contact with each other if these HSGs 37 have a diameter greater than half of the diameter of the circumferential zone. Narrow spaces are present between the HSGs 37 in contact with each other. Since reactive gas for forming the capacitor insulating layer 38 can hardly be introduced into the narrow spaces, the step coverage of the capacitor insulating layer 38 is insufficient, hence, the capacitor insulating layer 38 has such thin sections. Since an oxidative species such as oxygen is exhausted in the narrow spaces during the oxidation of the capacitor insulating layer 38, the capacitor insulating layer 38 cannot be sufficiently oxidized. That is, the reactive gas in the narrow spaces is rarefied because the reactive gas is not sufficiently supplied to the narrow spaces.

When high electric fields are applied to the thin sections of the capacitor insulating layer 38, currents leak from the thin sections. A reduction in the thickness of the capacitor insulating layer 38 causes a decrease in the dielectric strength thereof. Although the capacitor insulating layer 38 is usually improved in dielectric strength by oxidation, there is a problem in that the capacitor insulating layer 38 has low dielectric strength because the oxidative species is insufficiently supplied to the narrow spaces.

SUMMARY OF THE INVENTION

Accordingly, it is an object of the present invention to provide a high-reliability semiconductor device and a method for manufacturing such a semiconductor device.

A semiconductor device of the present invention includes cylindrical capacitors each including corresponding cylindrical electrodes. Each cylindrical electrode includes HSGs, the HSGs protruding from an upper region of the cylindrical electrode have a large size, the hemispherical silicon grains protruding from an lower region of the cylindrical electrode have a small size or the lower region of the cylindrical electrode has no hemispherical silicon grains.

In the semiconductor device, the HSGs protruding from a circumferential zone the inner wall of each cylindrical electrode have a size less than half of the diameter of the circumferential zone.

In the semiconductor device, the cylindrical capacitors each have an opening; an upper circumferential zone, located below the opening, having a diameter greater than or equal to that of the opening; and a lower circumferential zone, located below the upper circumferential zone, having a diameter less than that of the opening.

In the semiconductor device, the outer walls of the cylindrical electrodes have no HSGs and the cylindrical capacitors have a crown shape.

A method for manufacturing a semiconductor device according to the present invention includes a step of forming an interlayer insulating layer on a semiconductor substrate; a step of defining capacitor-forming regions on the interlayer insulating layer and then removing portions of the interlayer insulating layer that correspond to the capacitor-forming regions to form cylindrical holes; a step of forming an amorphous semiconductor layer for forming lower electrodes for capacitors over the semiconductor substrate; a step of doping the amorphous semiconductor layer with an impurity such that the impurity concentration of portions of the amorphous semiconductor layer varies in the vertical direction, the portions being placed in the cylindrical holes; a step of seeding the amorphous semiconductor layer; a step of heat-treating the resulting amorphous semiconductor layer to form HSGs; a step of forming a capacitor insulating layer; and a step of forming an upper electrode for capacitors.

The method further includes a step of partly or entirely removing the interlayer insulating layer surrounding the lower electrodes.

In the method, the amorphous semiconductor layer is doped by ion implantation and lower portions of the amorphous semiconductor layer that are placed in the cylindrical holes have an impurity concentration greater than that of upper portions thereof.

In the method, the doping step includes a sub-step of forming an insulating layer on the amorphous semiconductor layer and a sub-step of partly doping the amorphous semiconductor layer with a gaseous impurity and lower portions of the amorphous semiconductor layer that are placed in the cylindrical holes have an impurity concentration greater than that of upper portions thereof.

A method for manufacturing a semiconductor device according to the present invention includes a step of forming an interlayer insulating layer on a semiconductor substrate; a step of defining capacitor-forming regions on the interlayer insulating layer and then removing portions of the interlayer insulating layer that correspond to the capacitor-forming regions to form cylindrical holes; a step of forming an amorphous semiconductor layer for forming lower electrodes for capacitors over the semiconductor substrate; a step of covering cylindrical lower portions of the amorphous semiconductor layer with insulating layers, the cylindrical lower portions being placed in the cylindrical holes; a step of seeding the amorphous semiconductor layer, a step of heat-treating the amorphous semiconductor layer to form HSGs; a step of forming a capacitor insulating layer; and a step of forming an upper electrode for capacitors.

This method further includes a step of partly or entirely removing the interlayer insulating layer surrounding the lower electrodes.

Since the capacitor insulating layer has a uniform thickness and therefore has no thin sections from which currents leak, the semiconductor device has high reliability. The semiconductor device can be manufactured by a method of the present invention.

BRIEF DESCRIPTION OF THE DRAWINGS

FIG. 2 is a sectional view showing a first step included in the method of the first embodiment;

FIG. 3 is a sectional view showing a second step included in the method of the first embodiment;

FIG. 4 is a sectional view showing a third step included in the method of the first embodiment;

DESCRIPTION OF THE PREFERRED EMBODIMENTS

A semiconductor device according to the present invention and methods for manufacturing semiconductor devices according to the present invention will now be described with reference to the accompanying drawings.

First Embodiment

Figure 1:
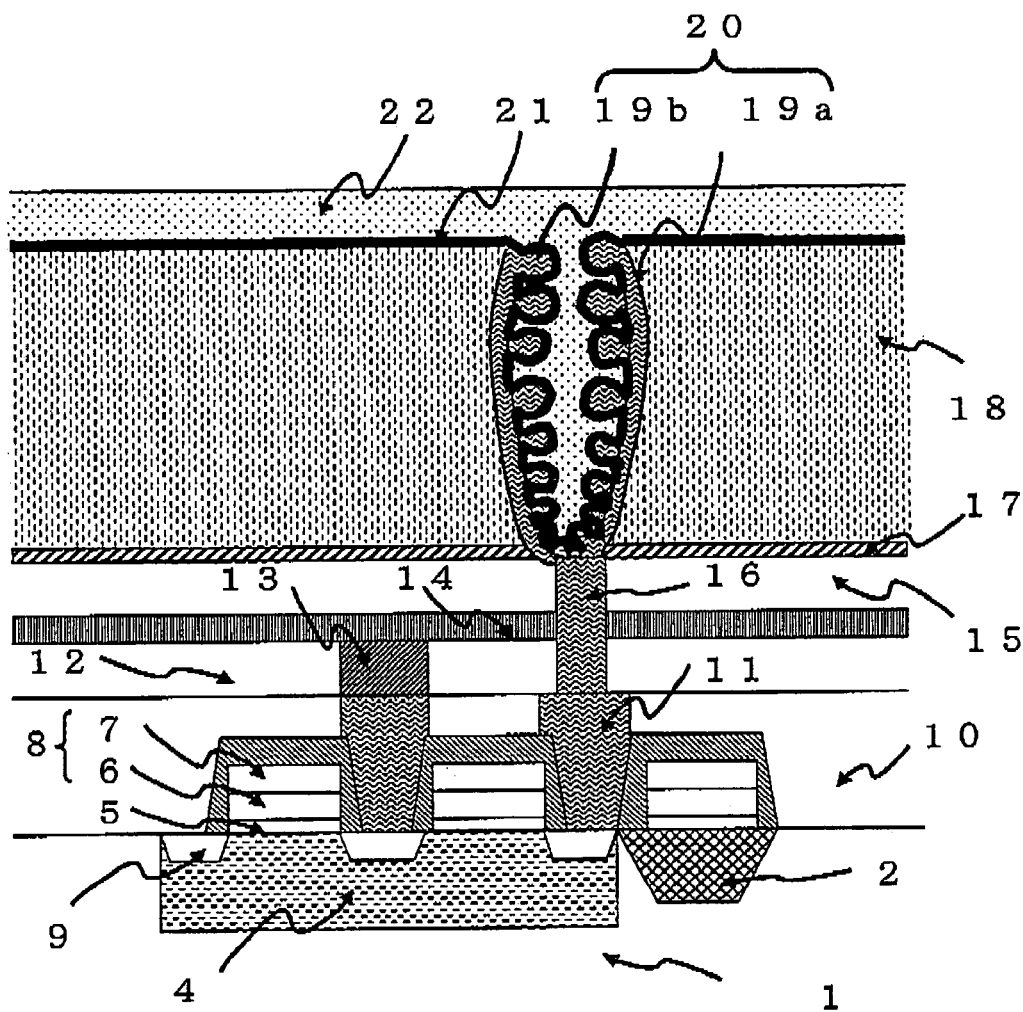
FIG. 1 is a sectional view showing a cylindrical capacitor prepared by a method according to a first embodiment of the present invention.

A method for manufacturing a semiconductor device according to a first embodiment of the present invention will now be described with reference to FIGS. 1 to 9. FIG. 1 is a sectional view showing one of cylindrical capacitors included in the semiconductor device manufactured by the method of this embodiment. FIGS. 2 to 9 are sectional views showing principal steps of manufacturing the semiconductor device.

As shown in FIG. 2, isolation regions 2 are formed in a semiconductor substrate 1 and gate transistors 3 for driving memory cells are then formed on p-well regions 4 arranged in the semiconductor substrate 1. The gate transistors 3 each include corresponding gate electrodes 8, source/drain diffusion regions 9 aligned with the gate electrodes 8. The gate electrodes 8 each include corresponding gate insulating layers 5, polysilicon layers 6, and suicide layers 7, those layers being arranged in that order. Portions of the gate electrodes 8 that extend in the isolation regions 2 are used as wires.

As shown in FIG. 3, a first interlayer insulating layer 10 is formed over the gate transistors 3 and contact holes are formed in the first interlayer insulating layer 10 so as to each extend to the corresponding source/drain diffusion regions 9. The contact holes are filled with polysilicon or amorphous silicon and unnecessary portions are then removed by etchback or CMP, whereby polysilicon plugs 11 are formed in the contact holes.

As shown in FIG. 4, after the polysilicon plugs 11 are formed, a second interlayer insulating layer 12 is formed over the polysilicon plugs 11 and the first interlayer insulating layer 10 and holes are then formed in the second interlayer insulating layer 12 by lithography and anisotropic dry etching. These holes are filled with TiN and W and unnecessary portions are then removed by etchback or CMP, whereby W plugs 13 are formed in the holes. TiN and W are deposited on the second interlayer Insulating layer 12 and bit lines 14 are formed by lithography and anisotropic dry etching.

Figure 5:
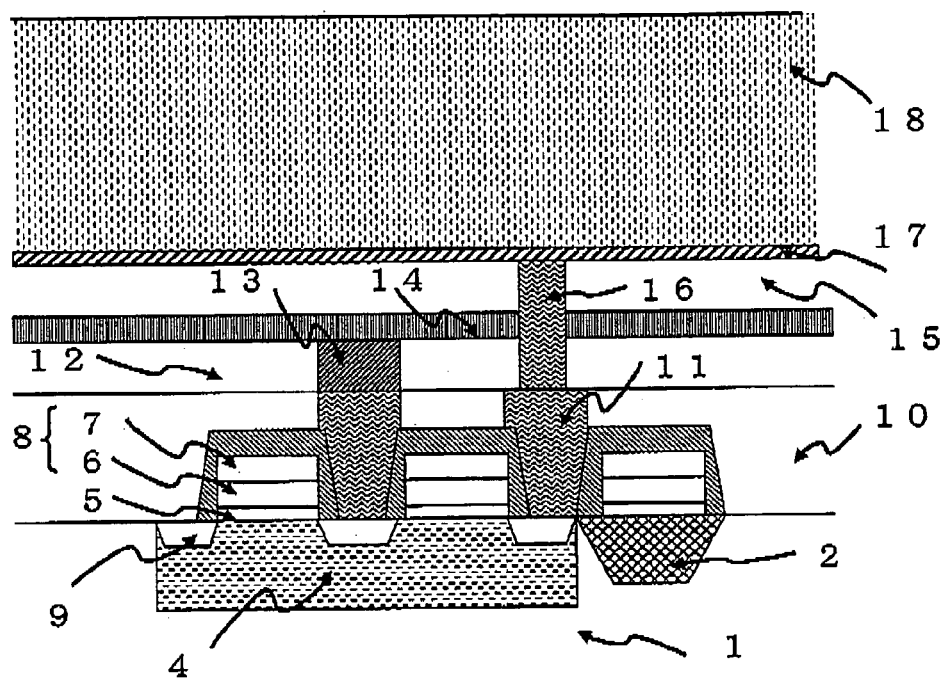
FIG. 5 is a sectional view showing a fourth step included in the method of the first embodiment.

As shown in FIG. 5, a third interlayer insulating layer 15 is formed over the bit lines 14 and holes are formed to reach the polysilicon plugs 11 by lithography and anisotropic dry etching. These holes are filled with polysilicon or amorphous silicon and unnecessary portions are then removed by etchback or CMP, whereby contact plugs 16 are formed in the holes. A nitride layer 17 is formed over the contact plugs 16 and the third interlayer insulating layer 15 and a plasma oxide layer 18 having a thickness of 2 to 3 µm is formed on the nitride layer 17.

Figure 6:
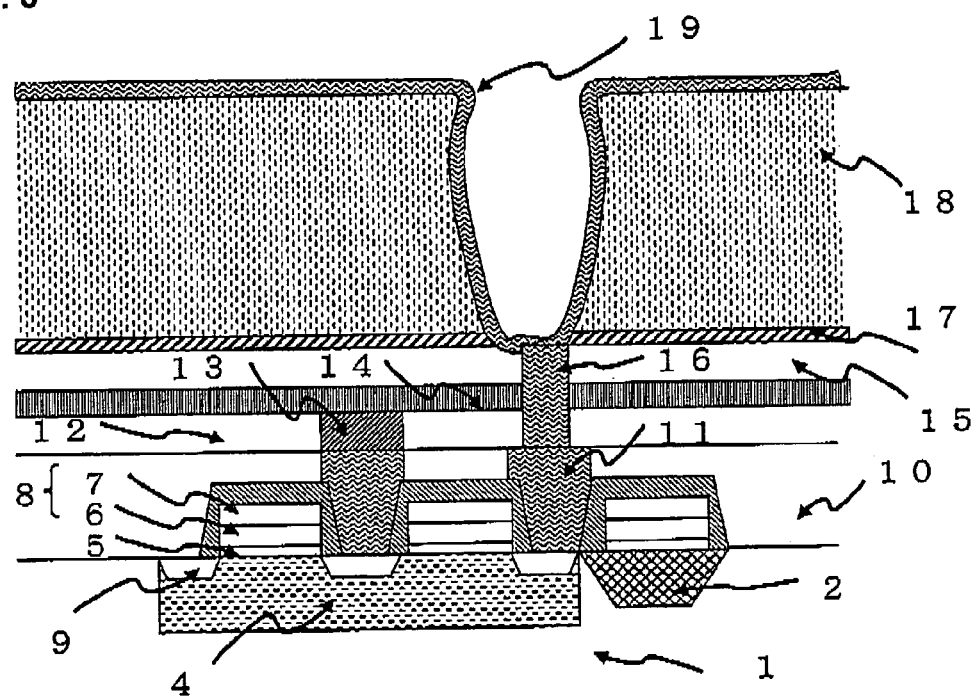
FIG. 6 is a sectional view showing a fifth step included in the method of the first embodiment.

As shown in FIG. 6, cylindrical capacitor holes extending through the nitride layer 17 and the plasma oxide layer 18 are formed by lithography and anisotropic dry etching. The capacitor holes formed by lithography each have the top openings having a diameter equal to its design value; however, the capacitor holes each have a upper zone, located below each opening having a diameter greater than that of the opening and also each have a lower zone, located below the upper zone, having a diameter less than the upper zone, the lower zone is tapered toward its bottom. And the capacitor hole has a bowing shape in cross section. The contact plugs 16 are each exposed at the bottoms of the corresponding capacitor holes. Since side faces of the contact plugs 16 are partly etched due to the misalignment between the capacitor holes and the contact plugs 16, the bottoms of the capacitor hole have recessed regions. An amorphous silicon layer 19 with a phosphorus concentration of 1E19 atoms/cm$^3$ is formed over the plasma oxide layer 18 and the walls and bottoms of the capacitor holes at a growth temperature of 500° C. to 600° C. The amorphous silicon layer 19 has a thickness less than or equal to a quarter of the diameter of the openings of the capacitor holes. In particular, the thickness of the amorphous silicon layer 19 is 20 to 50 nm. The amorphous silicon layer 19 is used to form cylindrical lower electrodes of the cylindrical capacitors.

Figure 7:
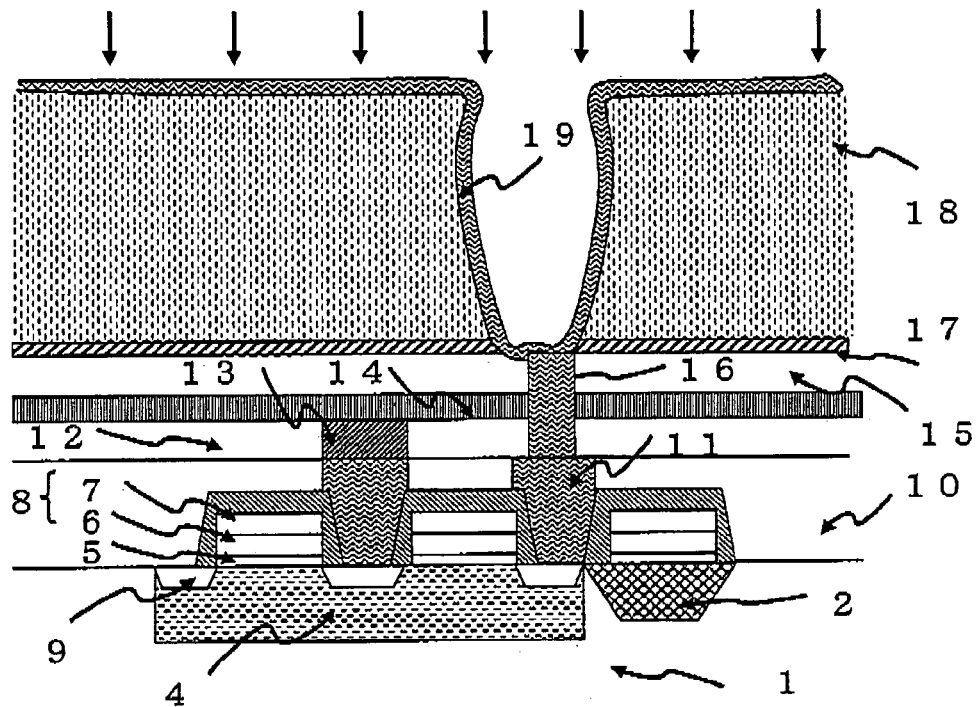
FIG. 7 is a sectional view showing a sixth step included in the method of the first embodiment.

As shown in FIG. 7, the amorphous silicon layer 19 is doped with an impurity, for example, phosphorus, under the following conditions: a dose of 5E14 atoms/cm$^2$, an incident angle of zero degrees, and an acceleration voltage of 100 keV. The resulting amorphous silicon layer 19 is further doped with an impurity, for example, phosphorus, under the following conditions: a dose of 1E14 atoms/cm$^2$, an incident angle of zero degrees, and an acceleration voltage of 10 keV. In this step, lower regions of the amorphous silicon layer 19 that are placed at lower zones of the capacitor holes are doped with the impurity so as to have an impurity concentration determined depending on the angle formed by each lower region of the amorphous silicon layer 19 and the plane parallel to the semiconductor substrate 1, the lower zones having diameters less than those of upper zones of the capacitor holes. In particular, the lower regions of the amorphous silicon layer 19 are more heavily doped with the impurity than other regions of the amorphous silicon layer 19.

Figure 8:
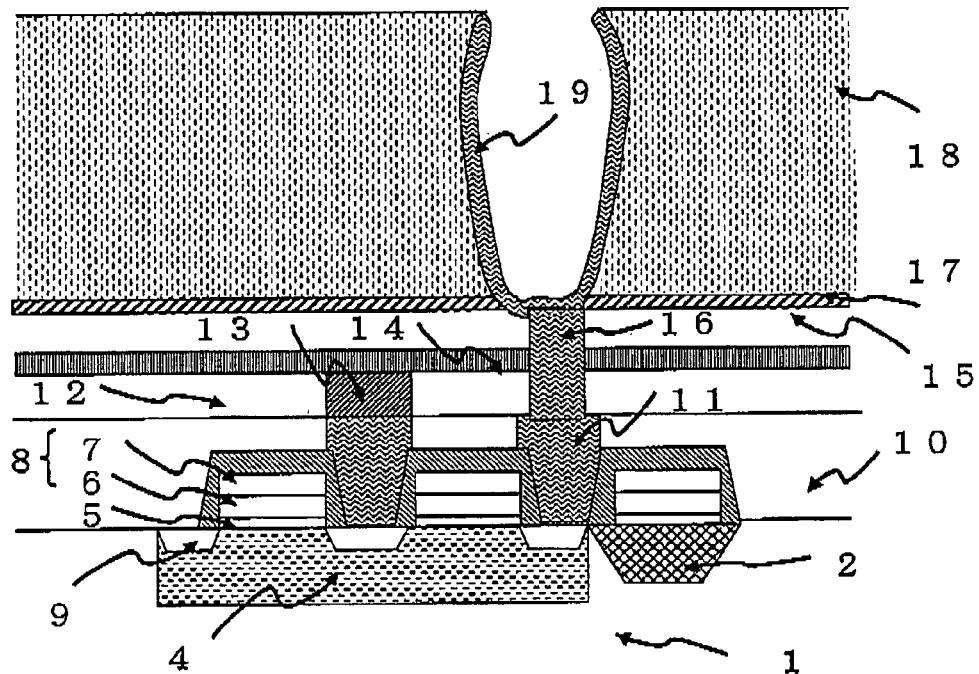
FIG. 8 is a sectional view showing a seventh step included in the method of the first embodiment.

A resist layer is provided on the amorphous silicon layer 19 and then partly removed by a photolithographic process such that portions of the resist layer that are located in the capacitor holes remain. As shown in FIG. 8, the amorphous silicon layer 19 is etched back such that regions of the amorphous silicon layer 19 remain in the capacitor holes, whereby amorphous silicon films separated from each other are prepared. The top ends of the amorphous silicon films are each located at a position 30 to 100 nm lower than the opening of each capacitor hole. The amorphous silicon films are processed into the lower electrodes (cylindrical electrodes) of the cylindrical capacitors. In this step, upper portions of the amorphous silicon layer 19 are removed by dry etching, the upper portions being doped with the impurity and extending from the positions 30 to 100 nm lower than the openings of the capacitor holes. The remaining portions of the resist layer are then removed with a hot aqueous solution containing persulfuric acid.

Figure 9:
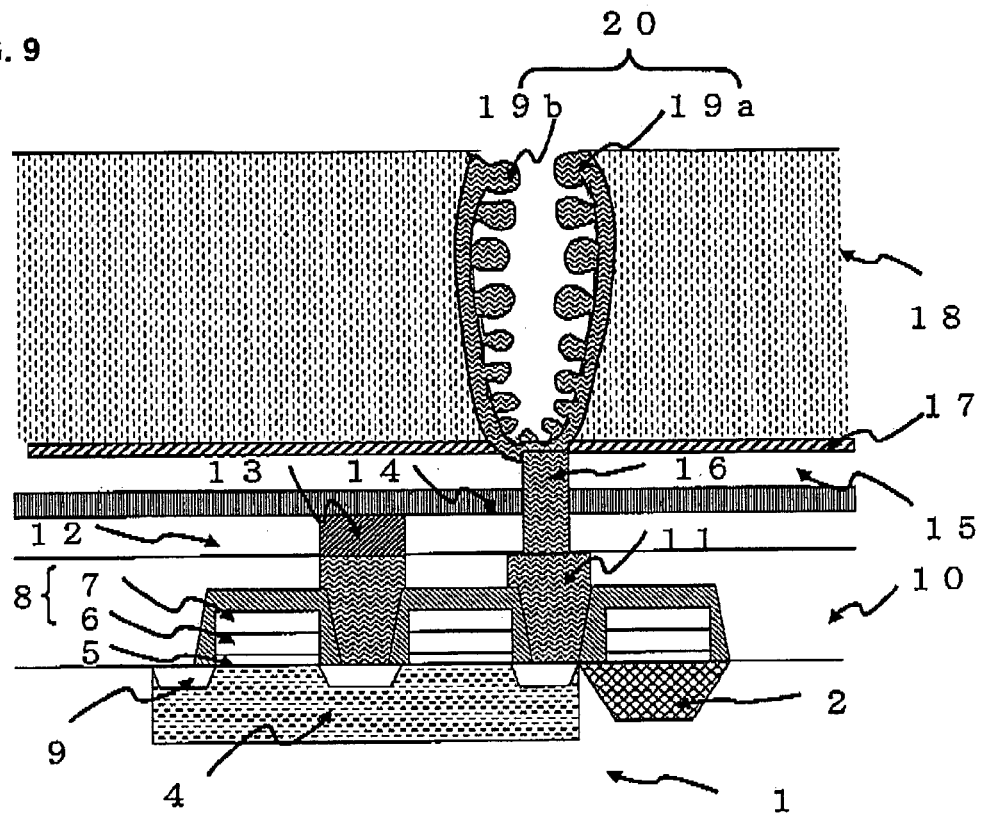
FIG. 9 is a sectional view showing an eighth step included in the method of the first embodiment.

The amorphous silicon layer 19 are cleaned, native oxides are removed therefrom. As shown in FIG. 9, fine crystal grains are formed at surface of the amorphous silicon layer 19 at a temperature of 550° C. to 570° C. with a HSG-forming apparatus using seeding gas containing monosilane or disilane. The fine crystal grains are grown by annealing, whereby HSGs 19b is prepared. The amorphous silicon layer 19 turns into HSGs 19b and the silicon layer 19a. And HSGs 19b and the silicon layer 19a serve as the lower electrodes of the cylindrical capacitors. The HSGs 19b protruding from upper regions of the silicon layer 19a have a size greater than that of the HSGs 19b protruding from lower regions of the silicon layer 19a having an impurity concentration greater than that of the upper regions thereof. Since the HSGs 19b protruding from the lower regions or the bottoms of the silicon layer 19a that are in contact with the contact plugs 16 have a smaller size, these HSGs 19b are not in contact with each other.

The HSGs 19b of upper regions have a larger size and the HSGs 19b of lower regions have a smaller size; that is, the HSGs 19b have different sizes depending on the vertical position where the HSGs 19b are present. The HSGs 19b protruding from a circumferential zone of the inner wall of each silicon layer 19a, which is cylindrical, have a size less than half of the diameter of the circumferential zone and are not therefore in contact with each other. The HSGs 19b protruding from a narrower circumferential zone of the inner wall thereof have a smaller size. The entire surface of the lower electrode 20 is rough. In order to prevent the lower electrodes 20 from being depleted and in order to reduce the resistance of the lower electrodes 20, the lower electrodes 20 are doped with an n-type impurity, for example, phosphorus, with a low-pressure CVD furnace such that the lower electrodes 20 have a phosphorus concentration of 5E20 atoms/cm$^3$.

A capacitor insulating layer 21 is formed over the lower electrodes 20 by vacuum CVD using reactive gas and then oxidized with oxidative gas. In this step, since the HSGs 19b protruding from the lower regions of the silicon layer 19a have a small size and are not therefore in contact with each other, the reactive gas can be uniformly diffused; hence, the capacitor insulating layer 21 can be formed so as to have a uniform thickness. An upper electrode 22 is provided on the capacitor insulating layer 21, whereby the cylindrical capacitors are prepared as shown in FIG. 1. Since the HSGs 19b protruding from a narrower circumferential zone of the inner wall of the-silicon layer 19a has a smaller size, there are no narrow spaces near a narrow circumferential zone of the inner wall and the capacitor insulating layer 21 therefore has a uniform thickness; hence, the cylindrical capacitors have good insulating properties.

As described above, in this embodiment, since lower regions of the amorphous silicon layer 19 are heavily doped with the impurity, the HSGs 19b protruding from the lower regions thereof have a smaller size and are not therefore in contact with each other. Thus, the reactive gas can be uniformly diffused, the capacitor insulating layer 21 formed by low-pressure CVD can be prevented from being deteriorated in coverage, and the concentration of the oxidative gas can be prevented from being partly reduced in the step of oxidizing the capacitor insulating layer 21. Since the oxidative gas can be uniformly diffused, the capacitor insulating layer 21 can be uniformly oxidized and therefore have improved insulating properties. Furthermore, since atomic mixing occurs at contact regions between the contact plugs 16 and the silicon layer 19a, the contact resistances between the contact plugs 16 and the silicon layer 19a are low; hence, the number of faulty electrical contacts is very small and high-speed operation is possible. The semiconductor device has high reliability because the semiconductor device includes the capacitor insulating layer 21 with a uniform thickness. The semiconductor device can be manufactured by the method of this embodiment as described above.

Second Embodiment

A method for manufacturing a semiconductor device according to a second embodiment of the present invention will now be described. An impurity used in this embodiment is different from that used in the ion implantation described in the first embodiment. Steps of the method of this embodiment are similar to the steps described in the first embodiment. Therefore, only steps different from those described in the first embodiment are described in this embodiment and the same steps as those described in the first embodiment are omitted.

As shown in FIG. 6, an amorphous silicon layer 19 for forming cylindrical lower electrodes of cylindrical electrodes is formed at a temperature of 500° C. to 600° C. so as to have a phosphorus concentration of, for example, 1E19 atoms/cm$^3$. The amorphous silicon layer 19 has a thickness less than or equal to a quarter of the diameter of the openings of capacitor holes. In particular, the thickness of the amorphous silicon layer 19 is 20 to 50 nm. As shown in FIG. 7, the amorphous silicon layer 19 is doped with an impurity, for example, boron, under the following conditions: a dose of 5E14 atoms/cm$^2$, an incident angle of zero degrees, and an acceleration voltage of 20 keV. In this step, lower regions of the amorphous silicon layer 19 that are placed at lower zones of the capacitor holes are doped with boron so as to have a boron concentration determined depending on the angle formed by each lower region of the amorphous silicon layer 19 and the plane parallel to a semiconductor substrate 1. In particular, the lower regions and bottoms of the amorphous silicon layer 19 are more heavily doped with boron than other regions of the amorphous silicon layer 19.

Subsequently, HSGs 19b are formed in the same manner as that described in the first embodiment. The HSGs 19b protruding from upper regions of the silicon layer 19a have a size greater than that of the HSGs 19b protruding from the lower regions having an impurity concentration greater than that of the upper regions thereof. Since the HSGs 19b protruding from the lower regions or the bottoms of the silicon layer 19a that are in contact with contact plugs 16 have a smaller size, these HSGs 19b are not in contact with each other. The HSGs 19b protruding from a circumferential zone of the inner wall of each silicon layer 19a, which is cylindrical, have a size less than half of the diameter of the circumferential zone. The HSGs 19b protruding from a narrower circumferential zone or the inner wall have a smaller size. The entire surface of the lower electrode 20 is therefore rough. In order to prevent the lower electrode 20 from being depleted and in order to reduce the resistance of the lower electrode 20, the lower electrodes 20 are doped with an n-type impurity, for example, phosphorus, with a low-pressure CVD furnace in the same manner as that described in the first embodiment such that the lower electrodes 20 have a phosphorus concentration of 5E20 atoms/cm$^3$.

The semiconductor device manufactured by the method of this embodiment has high reliability because the semiconductor device includes a capacitor insulating layer with a uniform thickness.

Third Embodiment

Figure 10:
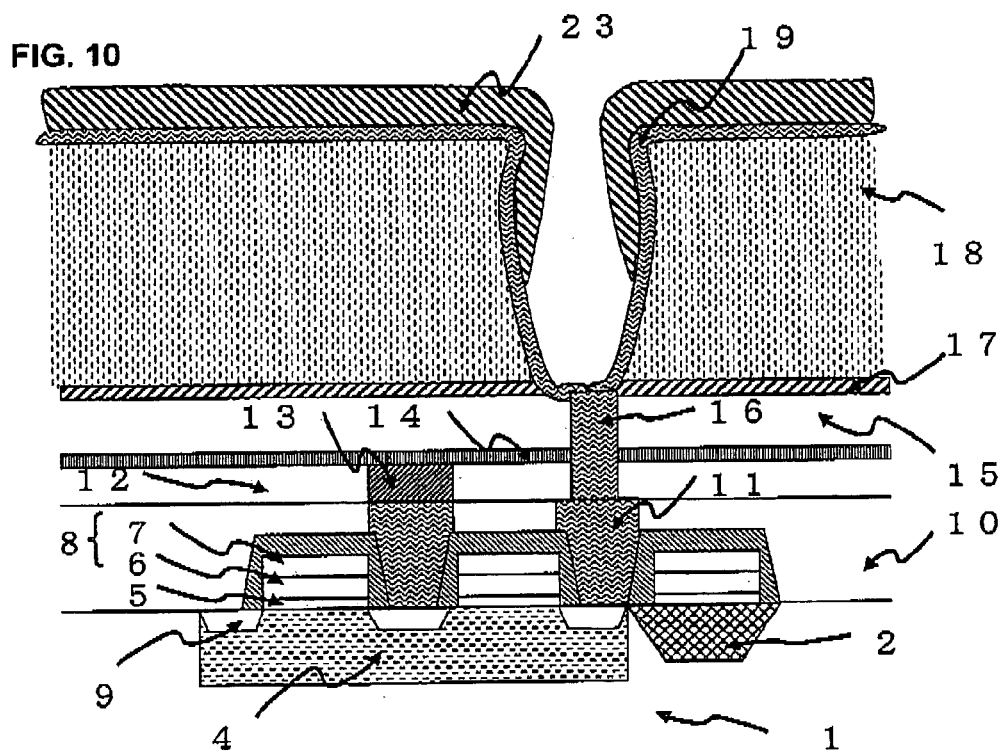
FIG. 10 is a sectional view showing a step included in a method according to a third embodiment.

A method for manufacturing a semiconductor device according to a third embodiment of the present invention will now be described with reference to FIG. 10. In this embodiment, doping is not performed by ion implantation but is performed using gas containing an impurity. The step shown in FIG. 10 is used in this embodiment instead of the doping step used in the first embodiment as shown in FIG. 7. In this embodiment, in order to simplify the description, the same components as those described in the first embodiment have the same reference numerals as those described in the first embodiment.

As shown in FIG. 10, an amorphous silicon layer 19, containing phosphorus, for forming cylindrical lower electrodes of cylindrical electrodes is formed at a temperature of 500° C. to 600° C. The amorphous silicon layer 19 has a thickness less than or equal to a quarter of the diameter of the openings of cylindrical capacitor holes for forming the lower electrodes. In particular, the thickness of the amorphous silicon layer 19 is 20 to 50 nm. An oxide layer 23 with a thickness of 50 nm is formed on the amorphous silicon layer 19 by plasma-enhanced CVD using, for example, TEOS. The oxide layer 23 has incomplete coverage; that is, flat top sections of the amorphous silicon layer 19 and upper sections of the amorphous silicon layer 19 that are located on upper regions of the walls of the capacitor holes are covered with the oxide layer 23 but lower sections of the amorphous silicon layer 19 that are located on lower regions of the walls thereof are hardly covered therewith. The oxide layer 23 is then slightly etched with dilute hydrofluoric acid such that the thickness of the oxide layer 23 is reduced by about 10 nm, whereby the lower sections of the amorphous silicon layer 19 are exposed. The area of the exposed lower sections thereof is adjusted by controlling conditions of plasma-enhanced CVD and/or the time of etching the amorphous silicon layer 19. Only the exposed lower sections are doped with an n-type impurity, for example, phosphorus, at 500° C. with a low-pressure CVD furnace by exposing the exposed lower sections to an atmosphere containing phosphorus.

In this step, the covered sections of the amorphous silicon layer 19 are not doped with the impurity but only the exposed lower sections, which are present in narrow portions of the capacitor holes, are doped therewith. Subsequently, the oxide layer 23 is removed and HSGs are formed in the same manner as that described in the first embodiment. The HSGs 19b protruding from upper regions of the silicon layer 19a have a size greater than that of the HSGs 19b protruding from the lower regions having an impurity concentration greater than that of the upper regions thereof. Since the HSGs protruding from the lower regions or the bottoms of the silicon layer 19a that are in contact with contact plugs have a smaller size, these HSGs 19b are not in contact with each other. The HSGs 19b protruding from a circumferential zone of the inner wall of each silicon layer 19a, which is cylindrical, have a size less-than half of the diameter of the circumferential zone. The HSGs protruding from a narrower circumferential zone of the inner wall have a smaller size. The entire surface of the lower electrode is therefore rough.

The semiconductor device manufactured by the method of this embodiment has high reliability because the semiconductor device includes a capacitor insulating layer with a uniform thickness.

Fourth Embodiment

A method for manufacturing a semiconductor device according to a fourth embodiment of the present invention will now be described with reference to FIGS. 11 to 14. In this embodiment, HSGs are not grown from narrow lower regions of cylindrical electrodes. This method includes the same steps as those, shown in FIGS. 2 to 6, described in the first embodiment. In this embodiment, in order to simplify the description, the same components as those described in the first embodiment have the same reference numerals as those described in the first embodiment.

Figure 11:
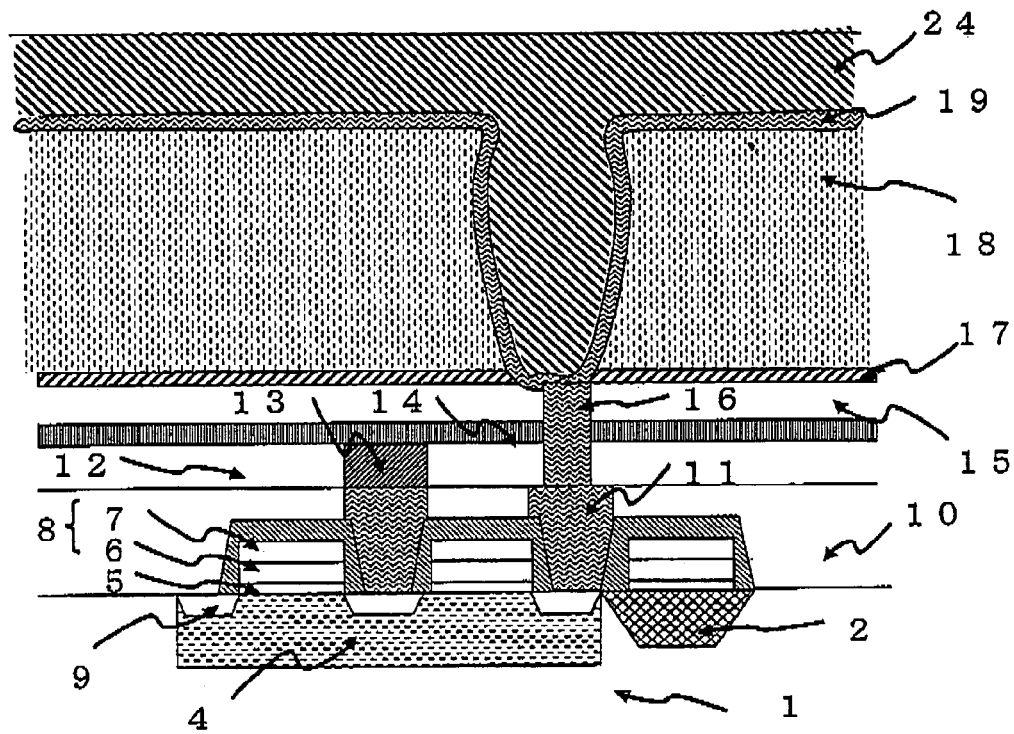
FIG. 11 is a sectional view showing a first step included in a method according to a fourth embodiment.
Figure 12:
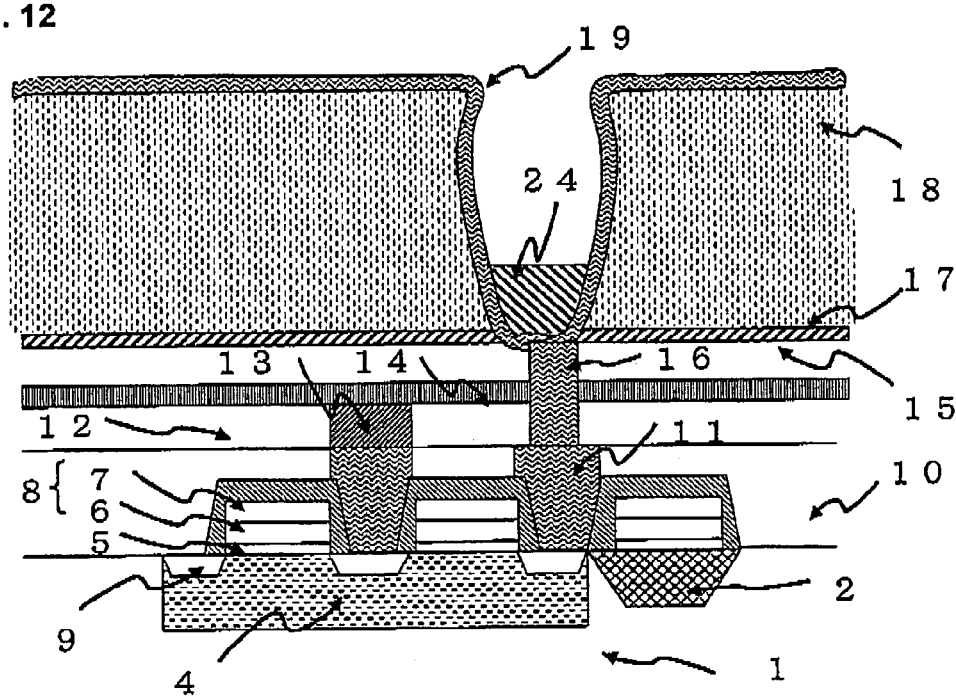
FIG. 12 is a sectional view showing a second step included in the method of the fourth embodiment.

After amorphous silicon layer 19 is formed in the same manner as illustrated in FIG. 6, an insulating layer 24 is formed as shown in FIG. 11 such that cylindrical capacitor holes are filled with portions of the insulating layer 24. The insulating layer 24 may be made of, for example, BPSG. As shown in FIG. 12, the insulating layer 24 is partly etched off such that portions of the insulating layer 24 remain only in lower regions of the capacitor holes. The lower regions of the capacitor holes have a diameter less than that of the openings of the capacitor holes. The insulating layer 24 can be wet- or dry-etched.

The amorphous silicon layer 19 is processed into separated cylindrical amorphous silicon layer 19 by removing flat portions of the amorphous silicon layer 19. A method for etching the insulating layer 24 and a method for partly removing the amorphous silicon layer 19 are not particularly limited and the following procedure may be used: flat portions of the insulating layer 24 and flat portions of the amorphous silicon layer 19 are removed by CMP and the other portions of the insulating layer 24 are then partly etched off such that small portions of the insulating layer 24 remain in the lower regions of the capacitor holes.

The top of each remaining portion of the insulating layer 24 is preferably located in a lower circumferential zone of each capacitor hole, the lower circumferential zone having a diameter equal to the diameter of the opening of the capacitor hole. This is because the openings of the capacitor holes have been designed such that HSGs 19b protruding from the silicon layer 19a are not in contact with each other. When the top of the remaining portion thereof is located at a higher position, the silicon layer 19a having the HSGs 19b have an area insufficient to achieve a desired capacitance. In contrast, when the top of the remaining portion thereof is located at a lower position, the HSGs 19b protruding from lower regions of the silicon layer 19a are in contact with each other and dead spaces are therefore present in the cylindrical capacitors. Therefore, a capacitor insulating layer 21 described below has thin sections, from which currents leak.

Figure 13:
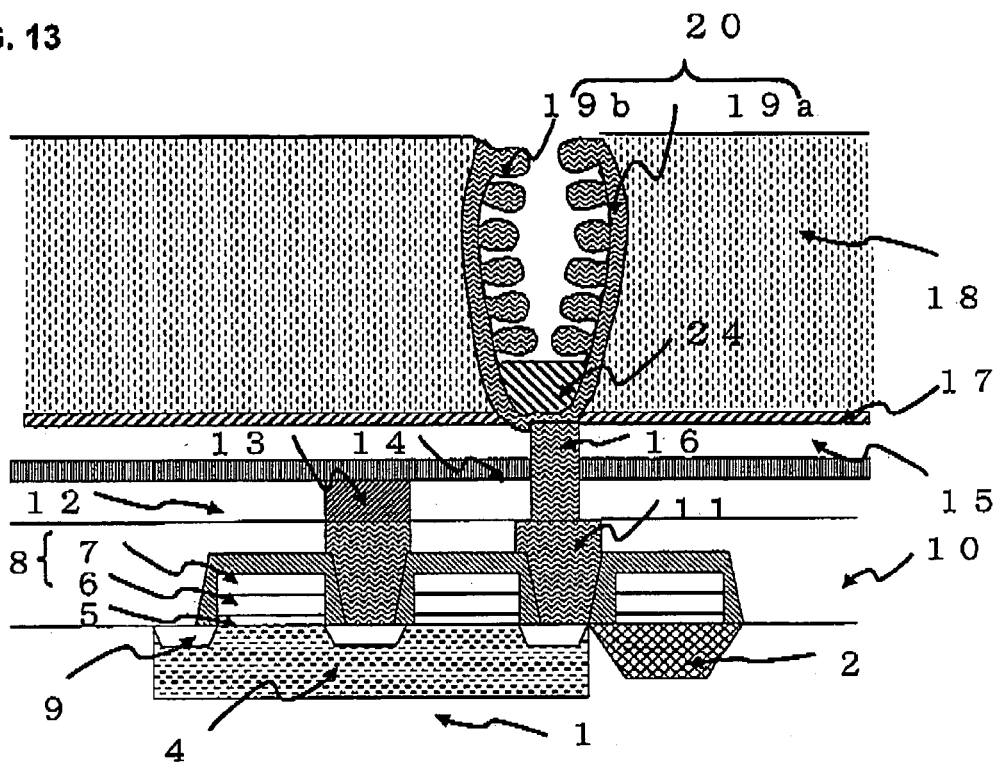
FIG. 13 is a sectional view showing a third step included in the method of the fourth embodiment.

The amorphous silicon layer 19 is cleaned, whereby native oxides are removed therefrom. As shown in FIG. 13, fine crystal grains are formed in the amorphous silicon layer 19 at a temperature of 550° C. to 570° C. with a HSG-forming apparatus using seeding gas containing monosilane or disilane. The fine crystal grains are grown by annealing, whereby the HSGs 19b are formed. Upper regions of the silicon layer 19a have the HSGs 19b but lower regions thereof have no HSGs 19b because the lower regions thereof are covered with the remaining portions of the insulating layer 24.

Figure 14:
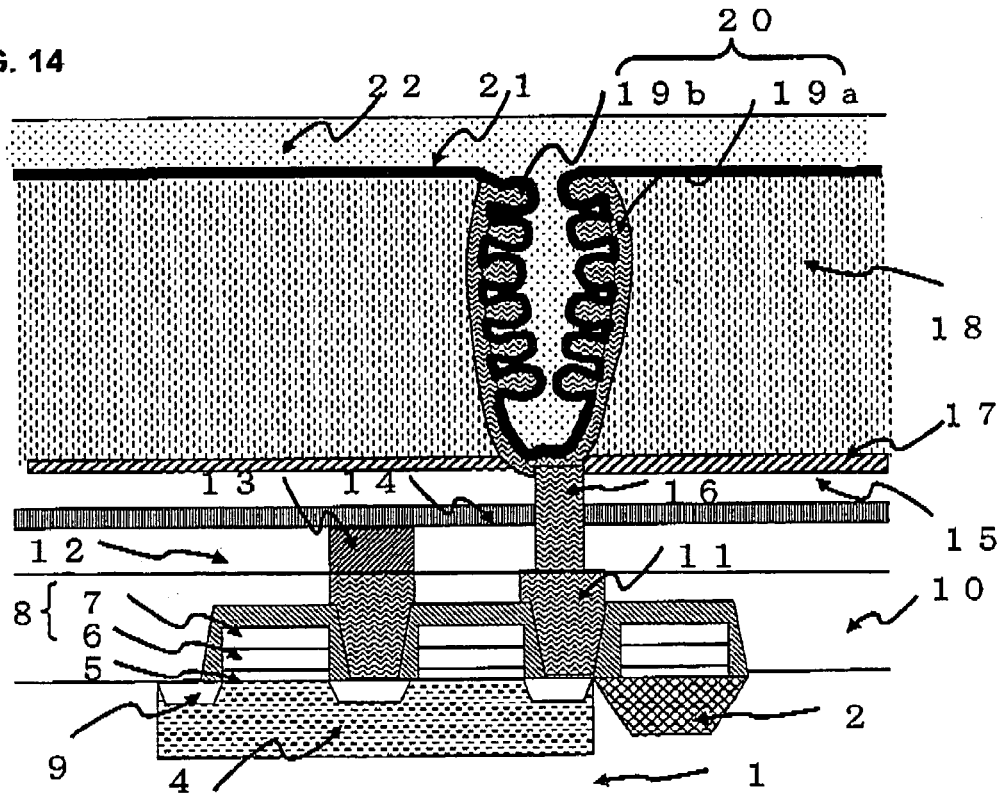
FIG. 14 is a sectional view showing a fourth step included in the method of the fourth embodiment.

As shown in FIG. 14, the remaining portions of the insulating layer 24 are removed from the capacitor holes by etching. In order to prevent the lower electrodes 20 from being depleted and in order to reduce the resistance of the lower electrodes 20, the lower electrodes 20 are doped with an n-type impurity, for example, phosphorus, with a low-pressure CVD furnace such that the lower electrodes 20 have a phosphorus concentration of 5E20 atoms/cm³. The capacitor insulating layer 21 is then formed over the lower electrodes 20 by vacuum CVD using reactive gas and then oxidized with oxidative gas. In this step, since the lower regions of the lower electrodes 20 have no HSGs 19b, the reactive gas is uniformly diffused; hence, the capacitor insulating layer 21 has a uniform thickness. An upper electrode 22 is provided on the capacitor insulating layer 21, whereby the cylindrical capacitors are prepared.

As described above, in this embodiment, the lower regions of the lower electrodes 20 have no HSGs 19b because the lower regions thereof are covered with the remaining portions of the insulating layer 24. Therefore, the reactive gas can be uniformly diffused in narrow bottom regions of the lower electrodes 20 during the formation of the capacitor insulating layer 21; hence, the capacitor insulating layer 21 can be prevented from being deteriorated in coverage. Furthermore, the concentration of the oxidative gas can be prevented from being partly reduced in the step of oxidizing the capacitor insulating layer 21; hence, the capacitor insulating layer 21 can be uniformly oxidized and therefore have improved insulating properties. Accordingly, a high-reliability semiconductor device including a capacitor insulating layer with a uniform thickness can be manufactured by the method of this embodiment.

Fifth Embodiment

Figure 15:
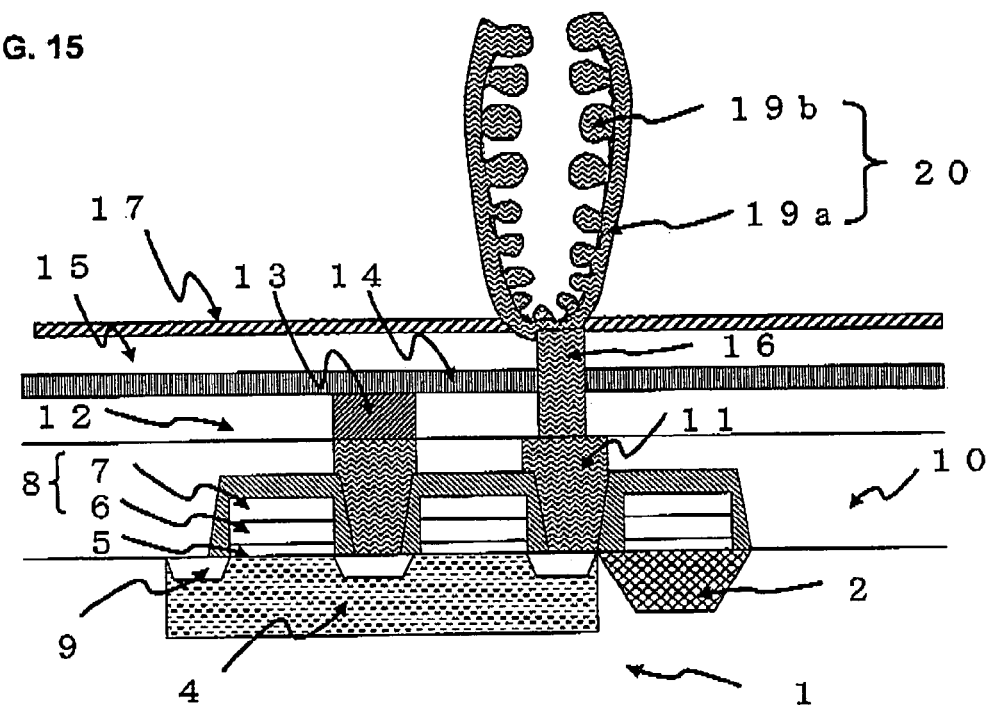
FIG. 15 is a sectional view showing a first step included in a method according to a fifth embodiment.
Figure 16:
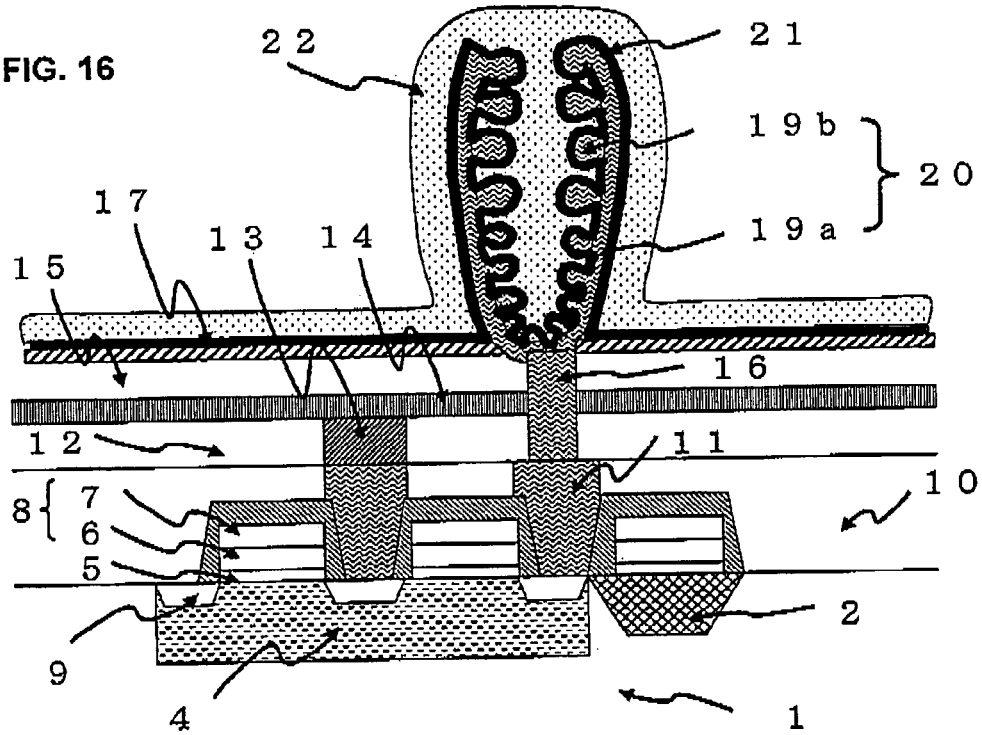
FIG. 16 is a sectional view showing a second step included in the method of the fifth embodiment.
Figure 17:
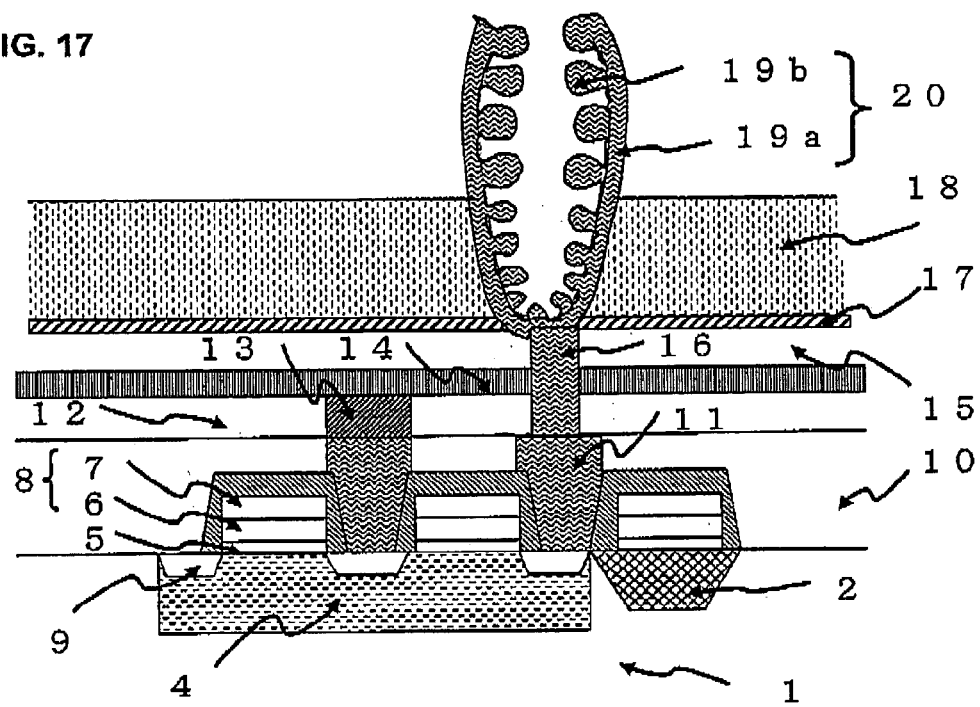
FIG. 17 is a sectional view showing a first step included in a modification of the method of the fifth embodiment.
Figure 18:
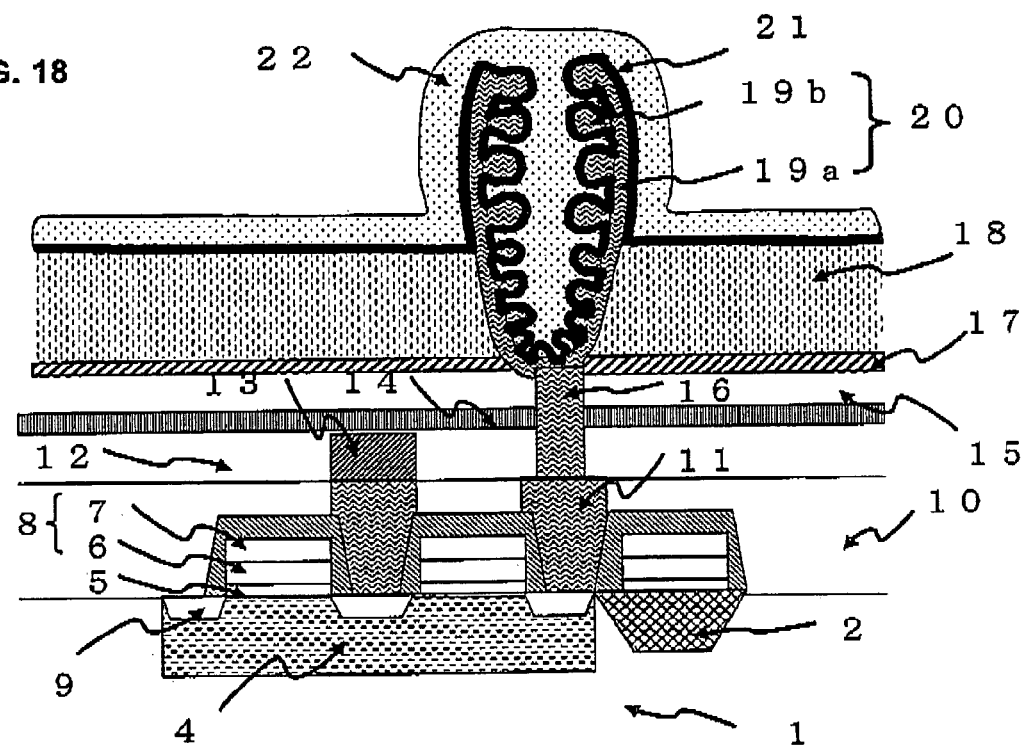
FIG. 18 is a sectional view showing a second step included in the modification of the method of the fifth embodiment.

A method for manufacturing a semiconductor device according to a fifth embodiment of the present invention will now be described with reference to FIGS. 15 to 18. In this embodiment, the semiconductor device includes cylindrical capacitors similar to the cylindrical capacitors described in the first, second, or third embodiment. The cylindrical capacitors used in this embodiment have a crown shape and each include corresponding cylindrical lower electrodes. Both the outer and inner walls of the lower electrodes 20 are covered with a capacitor insulating layer 21. The method of this embodiment includes a step identical to the step of forming the HSGs 19b protruding from the silicon layer 19a shown in FIG. 9 and steps prior to the HSG-forming step. FIGS. 15 and 16 are sectional views showing steps, subsequent to a HSG-forming step, included in the method of this embodiment. FIGS. 17 and 18 are sectional views showing steps, subsequent to such a HSG-forming step, included in a modification of the method of this embodiment. In this embodiment, in order to simplify the description, the same components as those described in the first, second, and third embodiments have the same reference numerals as those described in the first, second, and third embodiments.

In this embodiment, after HSGs 19b are formed, an oxide layer 18 surrounding the silicon layer 19a is etched off as shown in FIG. 15. In order to prevent the lower electrodes 20 from being depleted and in order to reduce the resistance of the lower electrodes 20, the lower electrodes 20 are doped with an impurity. The capacitor insulating layer 21 is formed over the lower electrodes 20 and then oxidized. An upper electrode 22 is formed on the capacitor insulating layer 21, whereby the cylindrical capacitors shown in FIG. 16 are prepared. These cylindrical capacitors having such a crown shape are different from those cylindrical capacitors described in the first, second, or third embodiment in that the outer walls of these cylindrical capacitors are covered with the capacitor insulating layer 21 having the upper electrode 22 placed thereon. Therefore, the outer and inner walls of these cylindrical capacitors are used as capacitor regions. The inner walls of the lower electrodes of this embodiment have a area about two times greater than that of the inner walls of lower electrodes of known cylindrical capacitors including no HSGs. Since the outer walls of the lower electrodes of this embodiment are used as capacitor regions, the lower electrodes of this embodiment have a surface area about three times greater than that of the lower electrodes of-such known cylindrical capacitors.

A modification of the method of this embodiment will now be described with reference to FIGS. 17 and 18. As shown in FIG. 17, an oxide layer 18 surrounding silicon layer 19a is partly etched off such that the thickness of the oxide layer 18 is reduced by about half. In order to prevent lower electrodes 20 from being depleted and in order to reduce the resistance of the lower electrodes 20, the lower electrodes 20 are doped with an impurity. A capacitor insulating layer 21 is then formed over the lower electrodes 20 and then oxidized. An upper electrode 22 is formed on the capacitor insulating layer 21, whereby crown-shaped cylindrical capacitors are prepared as shown in FIG. 18. In this embodiment, half of the outer wall of each cylindrical capacitor of this modification is used as a capacitor region. The inner walls of the lower electrodes of this modification have an area about two times greater than that of the inner walls of lower electrodes of known cylindrical capacitors including no HSGs. Since half of the outer wall of each lower electrode of this modification is used as a capacitor region, the lower electrode of this modification has a surface area about 2.5 times greater than that of the lower electrodes of such known cylindrical capacitors.

In this modification, although the thickness of the oxide layer 18 surrounding the lower electrodes is reduced by about half, the remaining half of the oxide layer 18 supports the lower electrodes to prevent the lower electrodes from falling down. With reference to FIG. 15, the lower electrodes are fixed with contact plugs 16 having small sections in contact with the lower electrodes. On the other hand, with reference to FIG. 17, the lower electrodes are supported by the etched oxide layer 18 having a thickness substantially equal to half of its original thickness and therefore prevented from falling down.

The amount of the reduction in the thickness of the oxide layer 18 may be determined depending on the strength of the lower electrodes. When the lower electrodes have high strength and are not therefore likely to fall down, the oxide layer 18 is completely removed. In this case, the lower electrodes have a large surface area. When the lower electrodes have low strength, the oxide layer 18 is partly removed, for example, the upper half of the oxide layer 18 is removed. In this case, the lower electrodes can securely be prevented from falling down.

In the cylindrical capacitors of this embodiment, the HSGs 19b protruding from upper regions of the inner walls of the silicon layer 19a have a larger size and the HSGs 19b protruding from lower regions of the inner walls thereof have a smaller size. The outer walls of the lower electrodes 20 are used as capacitor regions and the cylindrical capacitors have the crown shape; hence, the lower electrodes have a large surface area. Therefore, the cylindrical capacitors have a large capacitance; hence, semiconductor devices including the cylindrical capacitors operate with high stability.

Sixth Embodiment

Figure 19:
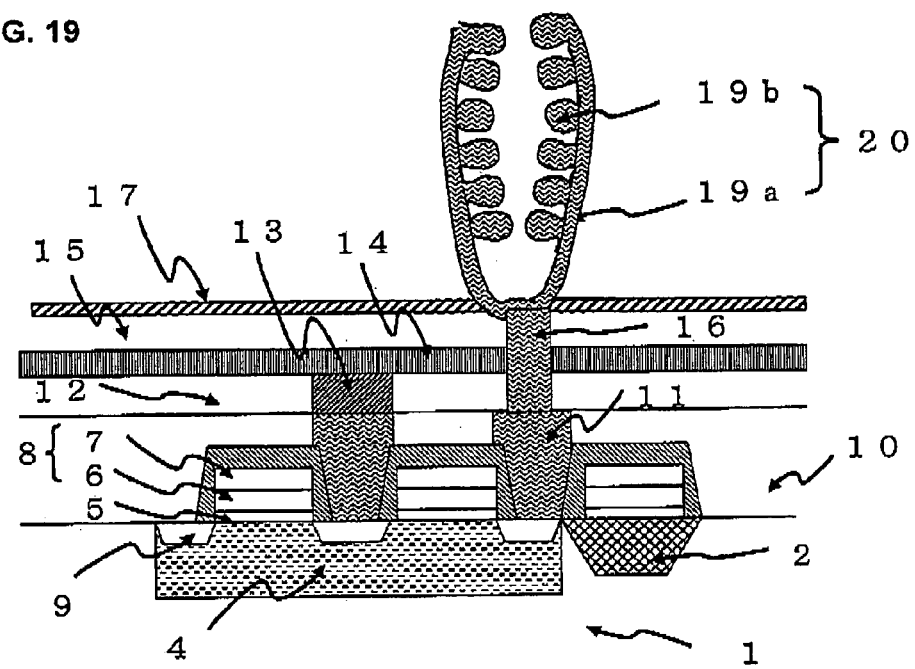
FIG. 19 is a sectional view showing a first step included in a method according to a sixth embodiment.
Figure 20:
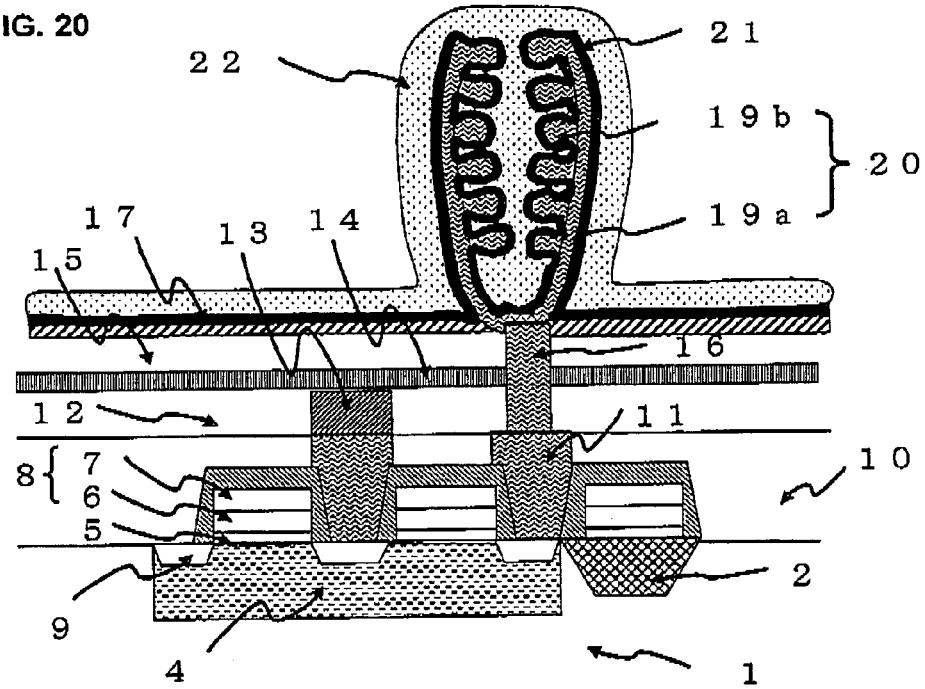
FIG. 20 is a sectional view showing a second step included in the method of the sixth embodiment.
Figure 21:
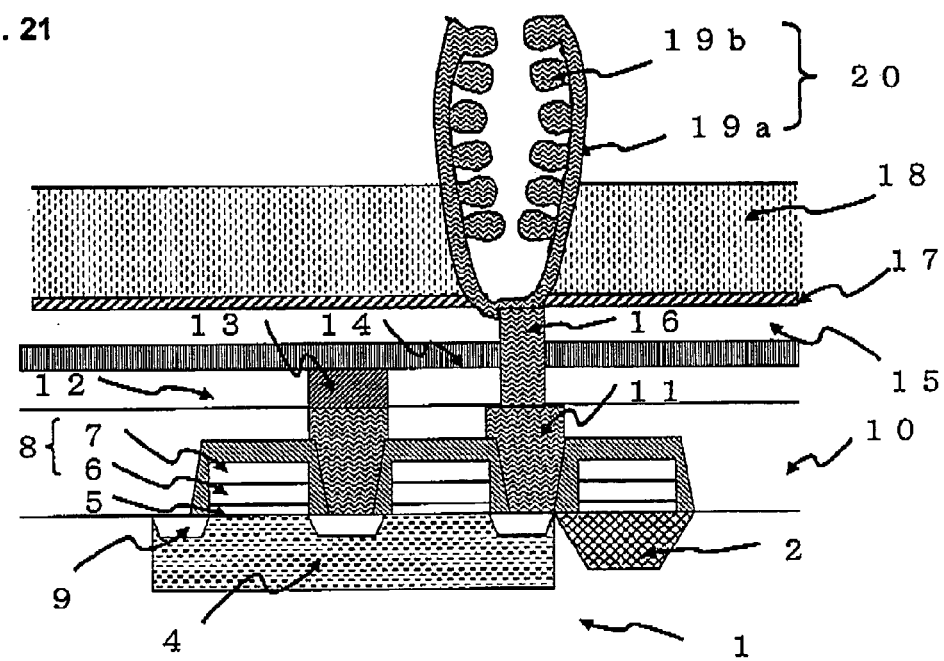
FIG. 21 is a sectional view showing a first step included in a modification of the method of the sixth embodiment.
Figure 22:
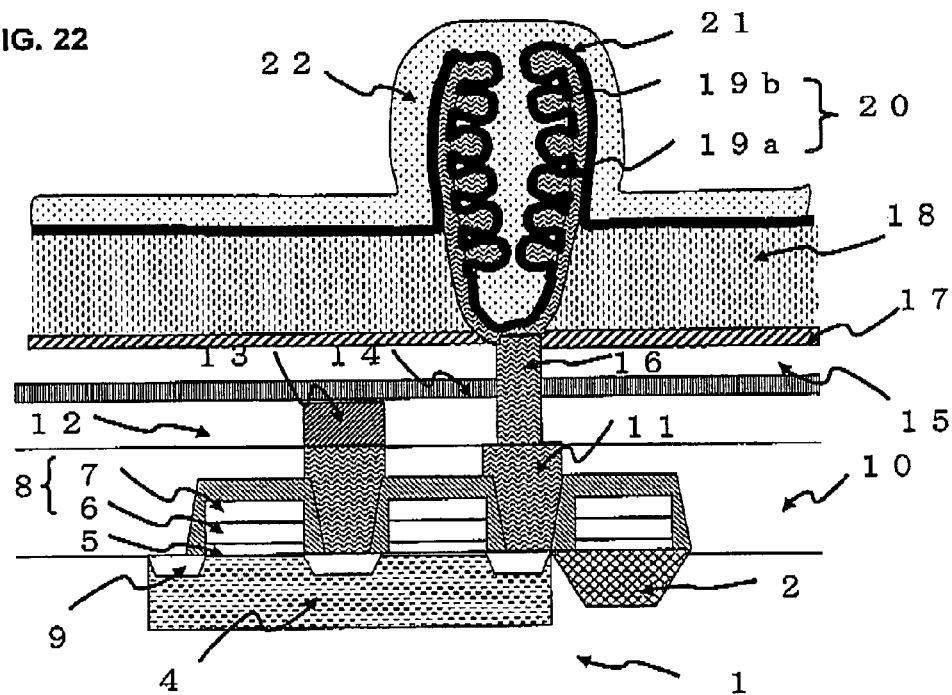
FIG. 22 is a sectional view showing a second step included in the modification of the method of the sixth embodiment.
Figure 23A:
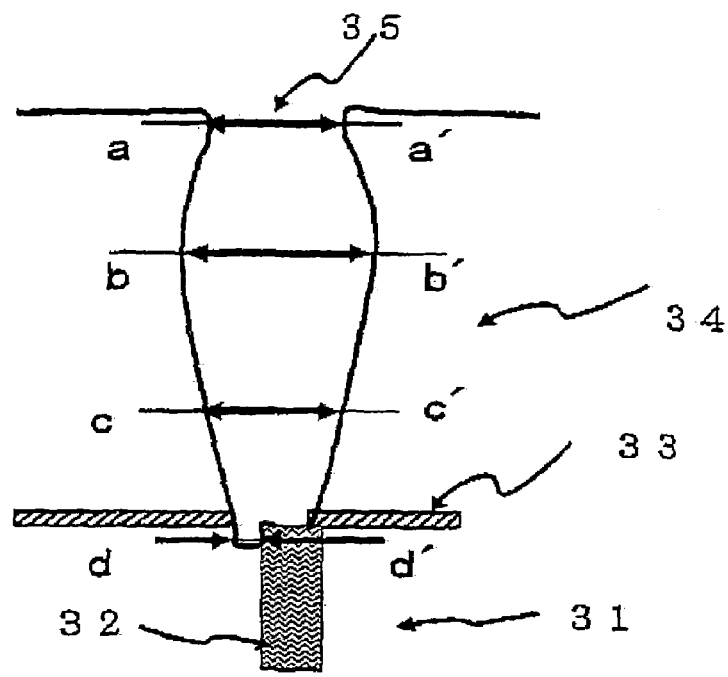
FIG. 23A is a sectional view showing a first step included in a known method.
Figure 23B:
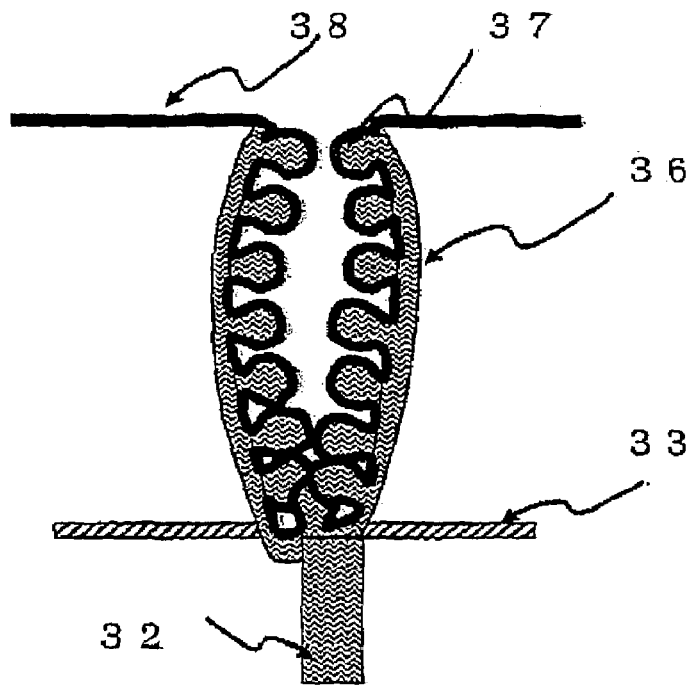
FIG. 23B is a sectional view showing a second step included in the known method.

A method for manufacturing a semiconductor device according to a sixth embodiment of the present invention will now be described with reference to FIGS. 19 to 22. The semiconductor device of this embodiment includes cylindrical capacitors similar to the cylindrical capacitors described in the fourth embodiment. The cylindrical capacitors of this embodiment have a crown shape and each include corresponding cylindrical lower electrodes. Both the outer and inner walls of the lower electrodes of this embodiment are covered with a capacitor insulating layer 21. The method of this embodiment includes a step identical to the step of forming the HSGs 19b protruding from the silicon layer 19a shown in FIG. 13 and steps identical to the steps prior to the HSG-forming step. FIGS. 19 and 20 are sectional views showing steps, subsequent to a HSG-forming step, included in the method of this embodiment. FIGS. 21 and 22 are sectional views showing steps, subsequent to such a HSG-forming step, included in a modification of the method of this embodiment. In this embodiment, in order to simplify the description, the same components as those described in the fourth embodiment have the same reference numerals as those described in the fourth embodiment.

In this embodiment, after HSGs 19b are formed as shown in FIG. 13 in the same manner as that described in the fourth embodiment, portions of an insulating layer 24 that are placed in capacitor holes and an oxide layer 18 surrounding the silicon layer 19a are etched off as shown in FIG. 19. In order to prevent the HSGs 19b from being depleted and in order to reduce the resistance of the lower electrodes 20, the lower electrodes 20 are doped with an impurity. A capacitor insulating layer 21 is formed over the lower electrodes 20 and then oxidized. An upper electrode 22 is formed on the capacitor insulating layer 21, whereby the cylindrical capacitors shown in FIG. 20 are prepared. The inner walls of the lower electrodes 20 of this embodiment have an area a little less than about two times that of the inner walls of lower electrodes 20 of known cylindrical capacitors including no HSGs. Since the outer walls of the lower electrodes 20 of this embodiment are used as capacitor regions, the lower electrodes 20 of this embodiment have a surface area a little less than three times that of the lower electrodes 20 of such known cylindrical capacitors.

A modification of the method of this embodiment will now be described with reference to FIGS. 21 and 22. As shown in FIG. 21, portions of an insulating layer 24 that are placed in capacitor holes are etched off and an oxide layer 18 surrounding lower electrodes 20 is partly etched off such that the thickness of the oxide layer 18 is reduced by about half. A capacitor insulating layer 21 is then formed over the lower electrodes 20 and then oxidized. An upper electrode 22 is formed on the capacitor insulating layer 21, whereby crown-shaped cylindrical capacitors can be prepared as shown in FIG. 22. In this modification, half of the outer wall of each cylindrical capacitor is used as a capacitor region. The inner walls of the lower electrodes 20 of this modification have an area a little less than two times that of the inner walls of lower electrodes 20 of known cylindrical capacitors including no HSGs. Since half of the outer wall of each lower electrode 20 of this modification is used as a capacitor region, the lower electrode 20 of this modification has a surface area a little less than 2.5 times that of the lower electrodes 20 of such known cylindrical capacitors.

In this modification, although the thickness of the oxide layer 18 surrounding the lower electrodes 20 is reduced by about half, the remaining half of the oxide layer 18 supports the lower electrodes 20 to prevent the lower electrodes 20 from falling down. With reference to FIG. 19, the lower electrodes 20 are fixed with contact plugs 16 having small sections in contact with the lower electrodes 20. On the other hand, with reference to FIG. 21, the lower electrodes 20 are supported by the etched oxide layer 18 having a thickness substantially equal to half of its original thickness and therefore prevented from falling down. The amount of the reduction in the thickness of the oxide layer 18 may be determined in the same manner as that described in the fifth embodiment.

In the cylindrical capacitors of this embodiment, the HSGs 19b protruding from upper regions of the inner walls of the lower electrodes 20 have a large size and lower regions of the lower electrode 20 inner walls and the bottoms of the lower electrodes 20 have no HSGs 19b. Regions of the outer walls of the lower electrodes are used as capacitor regions and the cylindrical capacitors have the crown shape; hence, the lower electrodes have a large surface area. Therefore, the cylindrical capacitors have a large capacitance; hence, semiconductor devices including the cylindrical capacitors operate with high stability.

Although the present invention is as described, a method of the present invention is useful in manufacturing cylindrical capacitors for semiconductor devices other than DRAMs. In the first embodiment, the nitride layer 17 is placed under the oxide layer 18 so as to function as a mask insulating layer for preventing components arranged under the nitride layer 17 from being etched. However, such a mask insulating layer may be used according to needs. If, for example, the etching rate of the third interlayer insulating layer 15 is less than that of the oxide layer 18, the nitride layer 17 can be omitted. Alternatively, an insulating layer made of another material may be placed on the oxide layer 18 so as to prevent the amorphous silicon layer 19 from being etched. Furthermore, in the fifth or sixth embodiment, an insulating layer made of another material may be provided in the oxide layer 18 so as to prevent the oxide layer 18 from being completely etched off.

While the present invention has been described in detail with reference to the embodiments, the present invention is not limited to the embodiments. Various modifications may be performed within the scope of the present invention. It should be understood that the present invention covers such modifications.

What is claimed is:

1. A semiconductor device comprising:
  cylindrical capacitors each including corresponding cylindrical electrodes,
  wherein each cylindrical electrode includes hemispherical silicon grains, the hemispherical silicon grains protruding from an upper region of the cylindrical electrode have a large size and the hemispherical silicon grains protruding from a lower region of the cylindrical electrode have a size smaller than the size of the grains in the upper region,
  wherein the cylindrical capacitors each have an opening; an upper circumferential zone located below the opening and having a diameter greater than or equal to that of the opening; and a lower circumferential zone located below the upper circumferential zone and having a diameter less than that of the opening.

2. The semiconductor device according to claim 1, wherein the hemispherical silicon grains protruding from a circumferential zone of the inner wall of each cylindrical electrode have a size less than half of the diameter of the circumferential zone.

3. The semiconductor device according to claim 1, wherein the outer walls of the cylindrical electrodes have no hemispherical silicon grains and the cylindrical capacitors have a crown shape.

4. A semiconductor device comprising:
  plural cylindrical capacitors that each include a corresponding cylindrical electrode,
  each said cylindrical electrode comprising an amorphous silicon wall that is doped with an impurity and hemispherical silicon grains protruding from an interior of the wall, a lower region of the wall adjacent to a bottom of the electrode being more heavily doped with the impurity than an upper region of the wall,
  the hemispherical silicon grains protruding from the upper region having a first size and the hemispherical silicon grains protruding from the lower region having a second size smaller than the first size.

5. The device of claim 4, wherein each of the cylindrical capacitors comprises an opening, wherein the upper region is adjacent to the opening and has a diameter greater than or equal to a diameter of the opening, and wherein the lower region is separated from the opening by the upper region and has a diameter less than the diameter of the opening.

6. The device of claim 4, wherein the impurity is one of phosphorus and boron.

7. A semiconductor device comprising:
  plural cylindrical capacitors that each include a corresponding cylindrical electrode,
  each said cylindrical electrode comprising a bottom, an amorphous silicon wall that extends from the bottom, and hemispherical silicon grains protruding from an interior of the wall, the wall having a lower region adjacent to the bottom and an upper region, the hemispherical silicon grains protruding from the upper region of the wall, the lower region and bottom not having hemispherical silicon grains protruding therefrom,
  wherein each of the cylindrical capacitors comprises an opening, wherein the upper region is adjacent to the opening and has a diameter greater than or equal to a diameter of the opening, and wherein the lower region is separated from the opening by the upper region and has a diameter less than the diameter of the opening.

* * * * *